United States Patent
Roh et al.

(10) Patent No.: US 9,542,269 B1
(45) Date of Patent: Jan. 10, 2017

(54) CONTROLLER CONTROLLING SEMICONDUCTOR MEMORY DEVICE AND OPERATING METHOD THEREOF

(71) Applicant: SK hynix Inc., Gyeonggi-do (KR)

(72) Inventors: Young Dong Roh, Gyeonggi-do (KR); Se Chun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 65 days.

(21) Appl. No.: 14/754,014

(22) Filed: Jun. 29, 2015

(51) Int. Cl.
G11C 29/00 (2006.01)
G06F 11/10 (2006.01)
G11C 29/52 (2006.01)

(52) U.S. Cl.
CPC ......... G06F 11/1048 (2013.01); G06F 11/106 (2013.01); G06F 11/1016 (2013.01); G11C 29/52 (2013.01)

(58) Field of Classification Search
CPC ... G06F 11/10; G06F 11/106; G06F 11/10102; G06F 11/1016; G06F 11/1048; G11C 29/52
See application file for complete search history.

(56) References Cited

U.S. PATENT DOCUMENTS

| | | | |
|---|---|---|---|
| 6,976,204 B1* | 12/2005 | Chambers | G06F 11/106 714/48 |
| 8,667,368 B2* | 3/2014 | Gupta | G06F 11/1064 365/185.12 |
| 2012/0297170 A1 | 11/2012 | Abdallah | |
| 2013/0067143 A1 | 3/2013 | Hasegawa et al. | |
| 2014/0208182 A1* | 7/2014 | Sakai | H03M 13/1117 714/755 |
| 2014/0372831 A1* | 12/2014 | Oh | G06F 11/1012 714/764 |

FOREIGN PATENT DOCUMENTS

KR 1020140099827 8/2014

* cited by examiner

*Primary Examiner* — Shelly A Chase
(74) *Attorney, Agent, or Firm* — IP & T Group LLP

(57) ABSTRACT

An operating method for controlling a semiconductor memory device according to an embodiment may include storing read commands in a command queue managed on first-in first-out basis; providing one of the read commands to the semiconductor memory device; determining whether the provided read command passes or fails based on read data, which is provided from the semiconductor memory device in response to the provided read command; and aborting remaining read commands in the command queue when the provided read command passes.

20 Claims, 10 Drawing Sheets

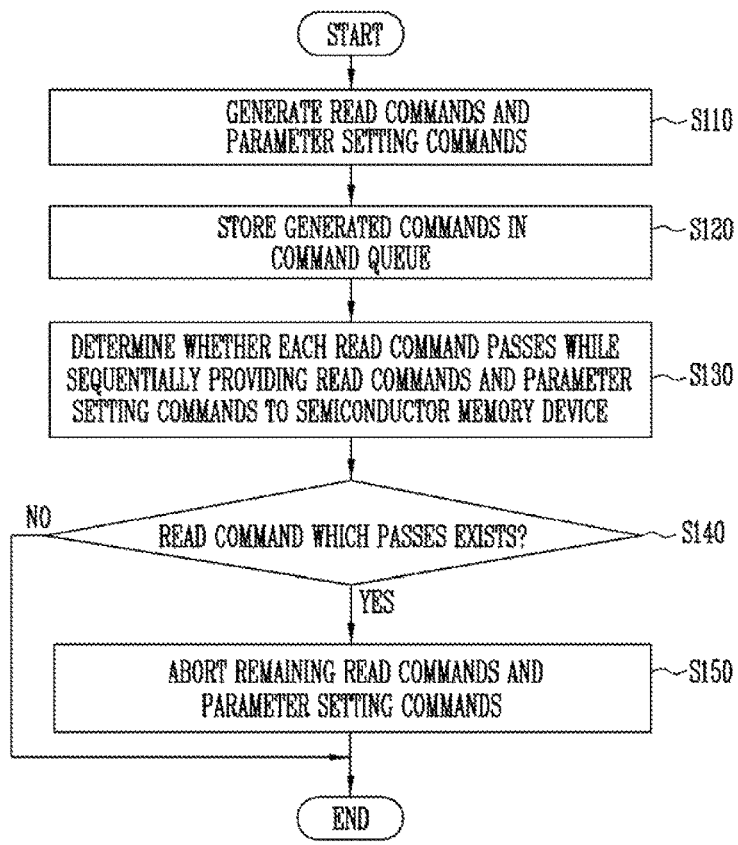
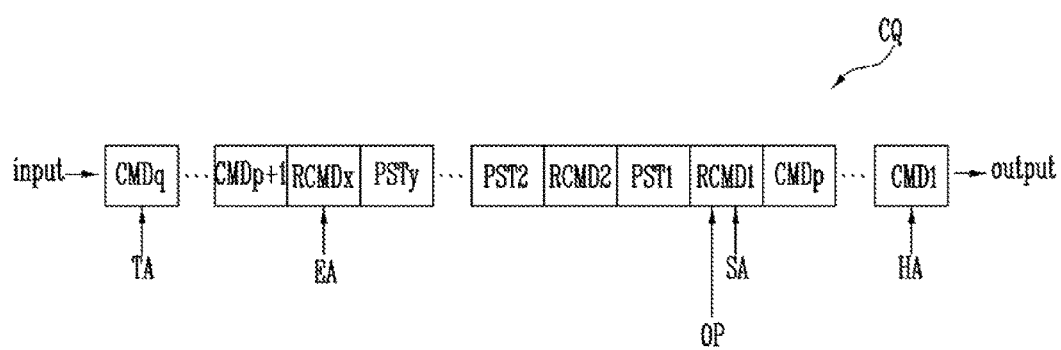

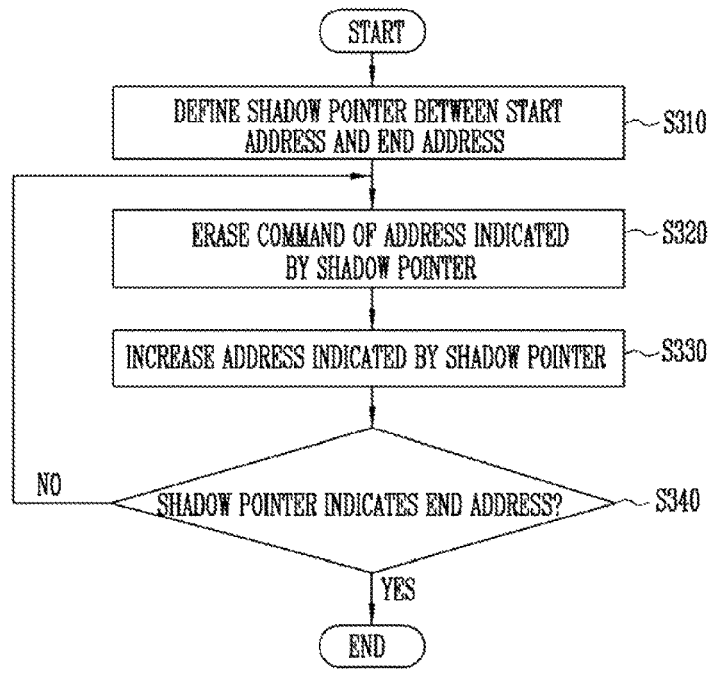
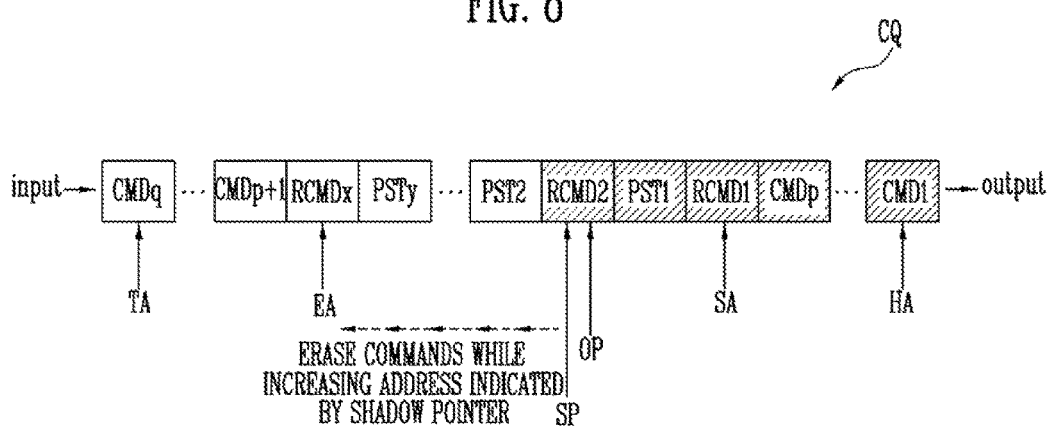

FIG. 13
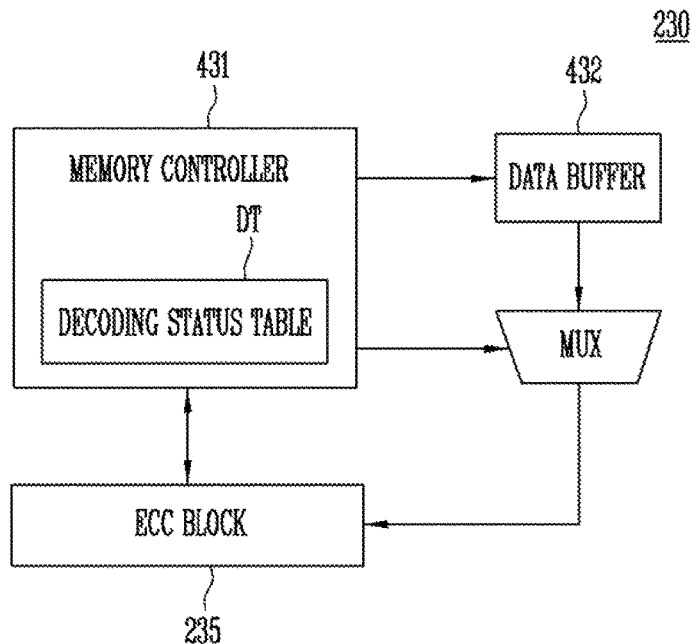
FIG. 14
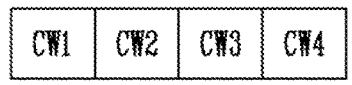
FIG. 15
| codeword | status |
|---|---|
| CW 1 | pass |
| CW 2 | pass |
| CW 3 | fail |
| CW 4 | fail |

CONTROLLER CONTROLLING SEMICONDUCTOR MEMORY DEVICE AND OPERATING METHOD THEREOF

BACKGROUND

Field of Invention

Various exemplary embodiments relate generally to an electronic device and, more particularly, to a controller controlling a semiconductor memory device and an operating method thereof.

Description of Related Art

Semiconductor memory devices are made of semiconductor materials such as silicon (Si), germanium (Ge), gallium arsenide (GaAs), and indium phosphide (Inp). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM) flash memory, Phase-change Random Access Memory (PRAM), Magnetic RAM (MRAM), Resistive RAM (RRAM) and Ferroelectric RAM (FRAM). Flash memories are classified into NOR-type memories and NAND-type memories.

A semiconductor memory device controller may generate commands at the request of a host and perform the generated commands. The controller may include a command queue to store commands. The command queue may be defined in a memory unit such as a RAM. Commands stored in the command queue may be sequentially output to the semiconductor memory device.

SUMMARY

An embodiment is directed to a controller having an improved operating time and an operating method thereof.

An operating method for controlling a semiconductor memory device according to an embodiment may include storing a plurality of read commands in a command queue managed on first-in first-out basis; providing one of the plurality of read commands to the semiconductor memory device; determining pass or fail of the provided read command based on read data, which is provided from the semiconductor memory device in response to the provided read command; and aborting the remaining read commands in the command queue when the provided read command passes.

The semiconductor memory device may include a plurality of pages, and the plurality of read commands may be commands for identifying data stored in one of the plurality of pages.

The determining may include performing ECC decoding on the read data, and the provided read command may pass when the ECC decoding passes.

The operating method may further include repeating the providing and determining with the remaining read commands when the provided read command fails.

The operating method may further include generating a plurality of parameter setting commands to change a setting value of the semiconductor memory device, the plurality of parameter setting commands being stored in the command queue, along with the plurality of read commands; and providing one of the plurality of parameter setting commands to the semiconductor memory device.

The aborting may include aborting remaining parameter setting commands in the command queue when the provided read command passes.

The setting value may correspond to a voltage applied to a word of the semiconductor memory device line during a read operation of the semiconductor memory device.

The command queue may include memory space from a head address to a tail address, and the plurality of read commands may be stored in memory space from a start address to an end address between the head and tail addresses.

The aborting may include generating a shadow painter pointing an address corresponding to first one of the remaining read commands when the provided read command passes; and erasing the remaining read commands pointed by the shadow pointer while moving the shadow pointer from a current address to a next address until the shadow pointer points to the end address.

The aborting may include sequentially dropping the remaining read commands between the start address and the end address.

The aborting may erase the remaining read commands stored in memory space between a start address and an end address in the command queue.

The determining may determine whether the provided read command fails when ECC decoding fails on one or more code words included in the read data.

The ECC decoding may be performed on one or more code words, on which the ECC decoding fails in the read data previously provided from the semiconductor memory device in response to previously provided read command.

A controller controlling a semiconductor memory device according to another embodiment may include a command queue managed on first-in first-out basis; a command generation unit suitable for storing a plurality of read commands in the command queue; a memory control unit suitable for: providing one of the plurality of read commands to the semiconductor memory device; and determining pass or fail of the provided read command based on read data, which is provided from the semiconductor memory device in response to the provided read command; and a command management unit suitable for aborting remaining read commands when the provided read command passes.

The semiconductor memory device may include a plurality of pages, and the plurality of read commands may be for identifying data stored in one of the plurality of pages.

The memory control unit may include a data buffer suitable for storing the read data provided from the semiconductor memory device in response to the provided read command; an error correction block suitable for performing ECC decoding on the read data in units of single code words; a decoding status table suitable for storing pass or fail information of the ECC decoding on each of code words included in the read data; and a multiplexing block suitable for providing the read data in single code word units from the data buffer to the error correction block; and a memory controller suitable for: controlling the multiplexing block to provide the error correction block with one or more code words, on which the ECC decoding fails in the read data previously provided from the semiconductor memory device in response to previously provided read command, by referring to the decoding status table; and updating the fail information stored in the decoding status table according to result of the ECC decoding.

The memory control unit may determine failures in the provided read command when ECC decoding fails on one or more code words included in the read data.

An operating method for controlling a semiconductor memory device including a plurality of pages according to an embodiment may include storing a plurality of commands for identifying data of a selected page in a command queue managed on first-in first-out basis; providing one of the plurality of commands to the semiconductor device; repeating the providing with remaining read commands when the provided read command fails; and aborting remaining read commands when the provided read command passes.

BRIEF DESCRIPTION OF THE DRAWINGS

FIG. 5 is a flowchart illustrating an operating method of a controller according to an embodiment;

FIG. 6 is a conceptual diagram illustrating a command queue;

FIG. 7 is a flowchart illustrating an embodiment of step S150 shown in FIG. 5;

FIG. 8 is a conceptual diagram illustrating an embodiment shown in FIG. 7;

FIG. 13 is a diagram illustrating a memory control unit shown in FIGS. 4 and 11;

FIG. 14 is a conceptual diagram illustrating code words included in read data;

FIG. 15 is a conceptual diagram illustrating a decoding status table shown in FIG. 13;

DETAILED DESCRIPTION

Figure 1:
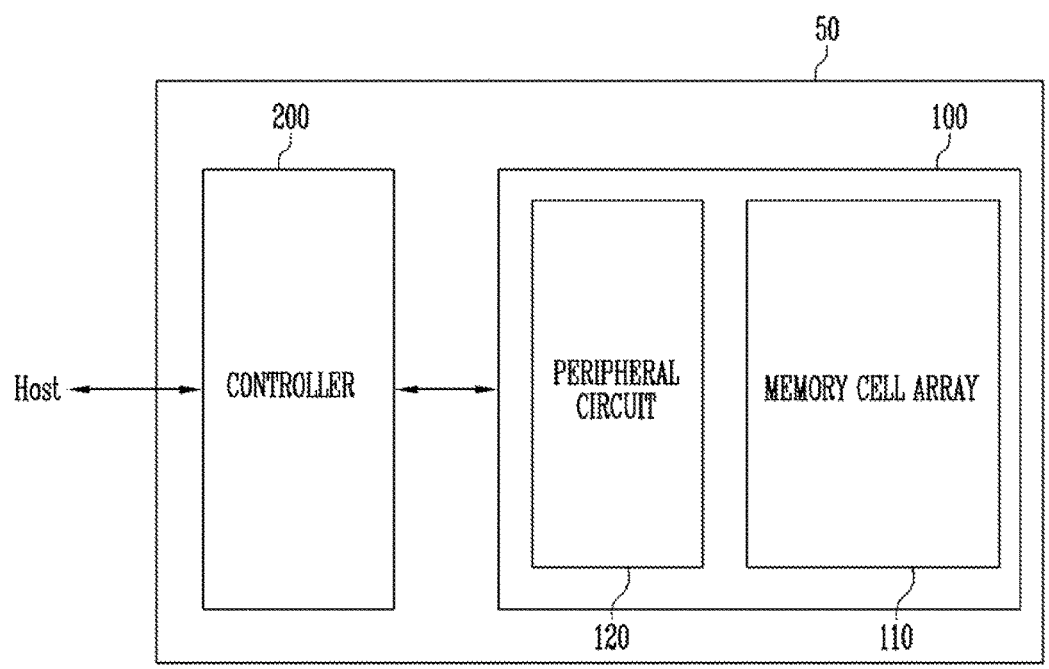
FIG. 1 is a block diagram illustrating a memory system according to an embodiment.

Hereinafter, various embodiments will be described in detail with reference to the accompanying drawings. The figures are provided to allow those with ordinary skill in the art to understand the scope of the embodiments of the invention. The present invention may, however be embodied in different forms and should not be construed as limited to the embodiments set forth. Rather, these embodiments are provided so that this disclosure will be thorough and complete. In addition, the embodiments are provided to fully convey the scope of the invention to those skilled in the art.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specified.

FIG. 1 is a block diagram illustrating a memory system 50 according to an embodiment.

Referring to FIG. 1, the memory system 50 may include a semiconductor memory device 100 and a controller 200.

The semiconductor memory device 100 may be controlled by the controller 200. The semiconductor memory device 100 may include a memory cell array 110 and a peripheral circuit 120 driving the memory cell array 110. The memory cell array 110 may include a plurality of non-volatile memory cells.

The peripheral circuit 120 may be controlled by the controller 200. Under the control of the controller 200, the peripheral circuit 120 may program data into the memory cell array 110, read the data from the memory cell array 110, and erase the data from the memory cell array 110.

According to an embodiment, a read operation and a program operation of the semiconductor memory device 100 may be performed in units of pages. An erase operation of the semiconductor memory device 100 may be performed in units of memory blocks.

During a program operation, the peripheral circuit 120 may receive a command indicating a program operation, a physical address and write data from the controller 200. A single memory block and a single page included therein may be specified by the physical address. The peripheral circuit 120 may program the write data into the corresponding page.

During a read operation, the peripheral circuit 120 may receive a command (hereinafter, read command) indicating the read operation and a physical address from the controller 200. A single memory block and a single page included therein may be specified by the physical address. The peripheral' circuit 120 may read data from the corresponding page and output the read data (hereinafter, read data) to the controller 200.

During an erase operation, the peripheral circuit 120 may receive a command indicating the erase operation and a physical address from the controller 200. The physical address may specify a single memory block. The peripheral circuit 120 may erase data of the memory block corresponding to the physical address.

According to an embodiment, the semiconductor memory device 100 may be a flash memory device.

The controller 200 may control the general operation of the semiconductor memory device 100. The controller 200 may access the semiconductor memory device 100 at the request of a host. For example, the controller 1200 may control a read operation, a program operation, an erase operation, and/or a background operation of the semiconductor memory device 100. The controller 200 may provide an interface between the semiconductor memory device 100 and the host. The controller 200 may drive firmware for controlling the semiconductor memory device 100.

When the host transfers a read request, the controller 200 may provide a read command to the semiconductor memory device 100 in order to identify data of a page corresponding to the read request. The controller 200 may convert a logical block address included in the read request into a physical block address. According to an embodiment, the controller 200 may function as a flash translation layer (FTL). The controller 200 may provide the generated physical address, along with the read command, to the semiconductor memory device 100.

In response to each read command, the semiconductor memory device 100 may transfer the read data to the controller 200. The controller 200 may determine whether an error is included in the read data. For example, the controller 200 may decode the read data according to an error correction code. Various types of error correction codes, such as Bose, Chaudhri, Hocquenghem (BCH) codes, Hamming codes, Reed Solomon codes, low density parity check (LDPC) codes, may be used. For example, when the read data includes more error bits than a predetermined number, the decoding may fail. When the read data includes error bits equal to or less than the predetermined number, the decoding may succeed.

Decoding success may mean that the corresponding read command passes, and decoding failure may mean that the corresponding read command fails. When decoding succeeds, the controller 200 may output the error-corrected read data to the host. When the decoding fails, the controller 200 may re-transfer the read command to the semiconductor memory device 100.

Figure 2:
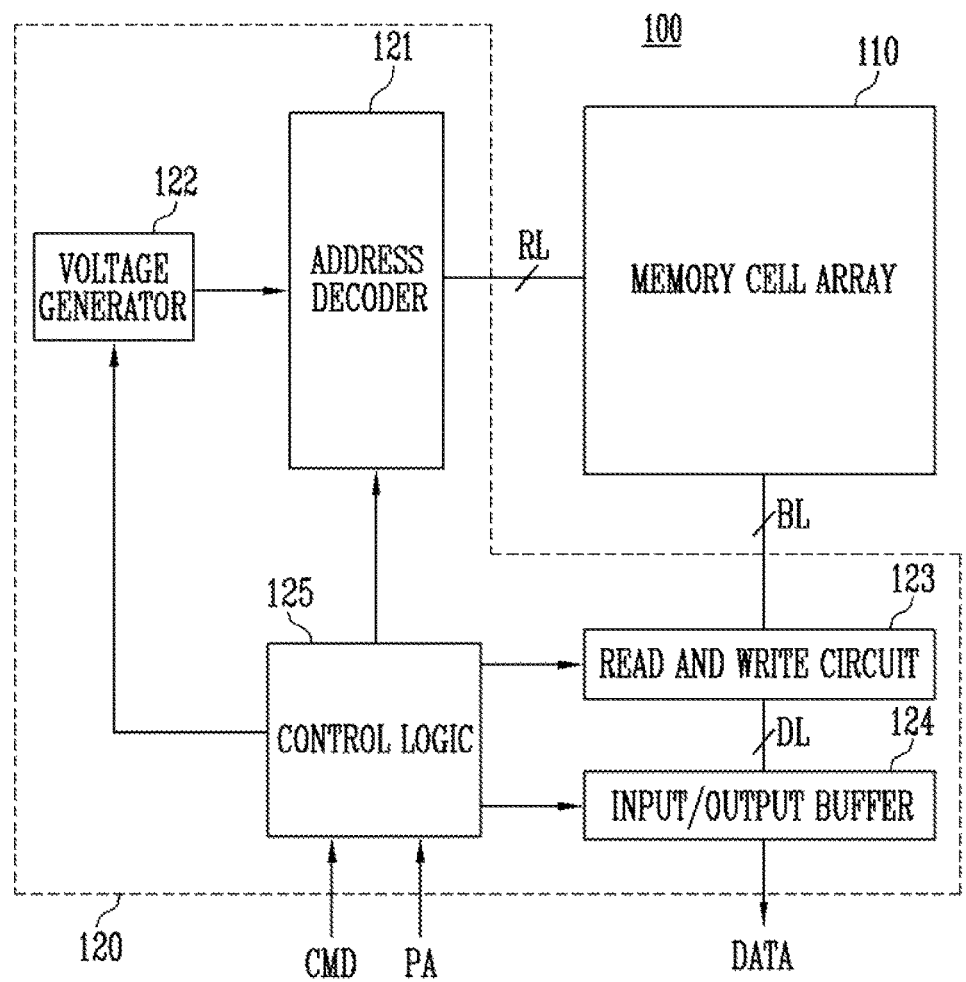
FIG. 2 is a block diagram illustrating a semiconductor memory device shown in FIG. 1.
Figure 3:
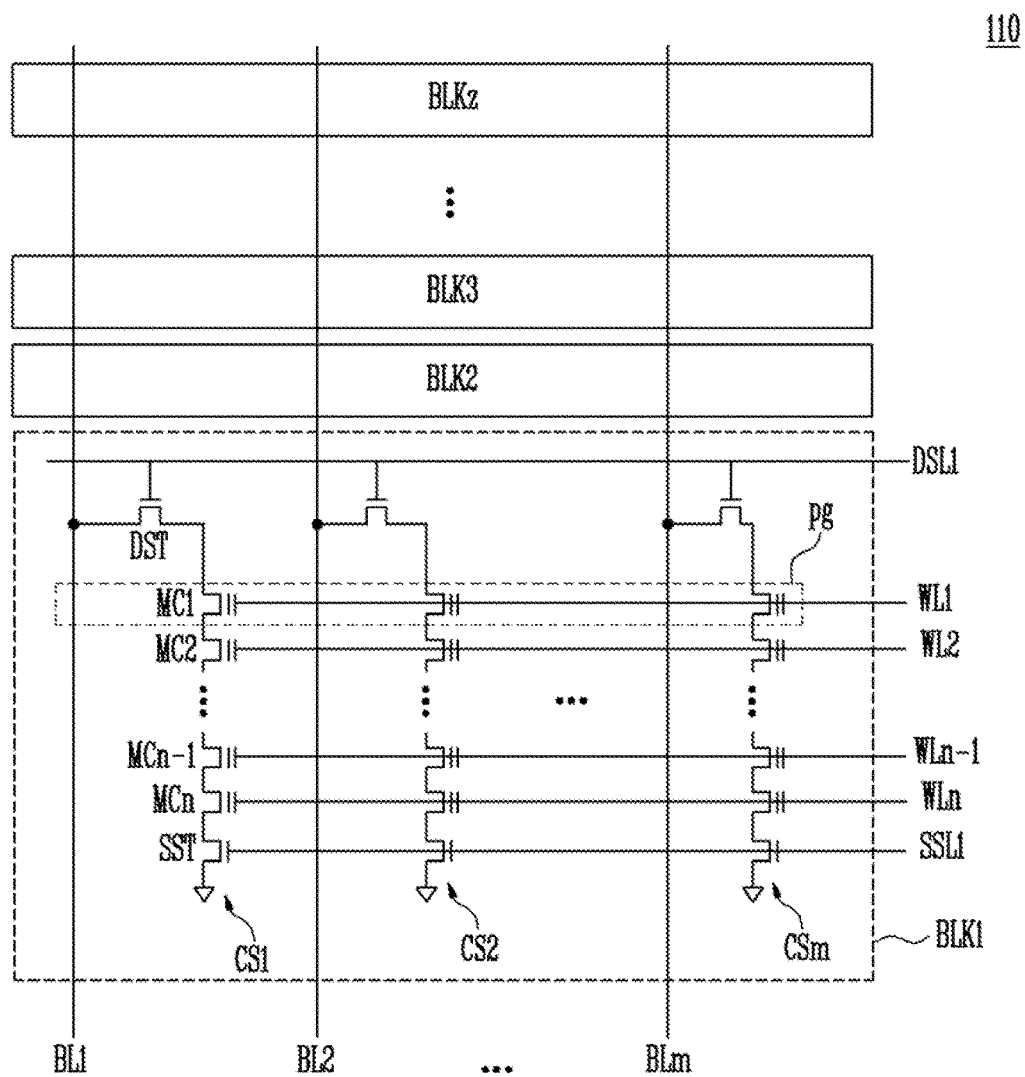
FIG. 3 is a block diagram illustrating a memory cell array shown in FIG. 2.

FIG. 2 is a block diagram illustrating the semiconductor memory device 100 described with reference to FIG. 1. FIG. 3 is a block diagram illustrating the memory cell array 110 shown in FIG. 2.

Referring to FIG. 2 the semiconductor memory device 100 may include the memory cell array 110 and the peripheral circuit 120.

The memory cell array 110 may include a plurality of memory cells. The plurality of memory cells may be coupled to an address decoder 121 through row lines RL and coupled to a read and write circuit 123 through bit lines BL.

Referring to FIG. 3, the memory cell array 110 may include a plurality of memory blocks BLK1 to BLKz. The first to $z^{th}$ memory blocks BLK1 to BLKz may be coupled in common to first to $m^{th}$ bit lines BL1 to BLm. The first to $m^{th}$ bit lines BL1 to BLm may form the bit lines BL shown in FIG. 2. Each of the memory blocks BLK1 to BLKz may form an erase unit.

In FIG. 3, elements included in one (BLK1) of the memory blocks BLK1 to BLKz are illustrated and elements included in the remaining memory blocks BLK2 to BLKz are omitted for clarity. Each of the remaining memory blocks BLK2 to BLKz may be configured in substantially the same manner as the first memory block BLK1.

The memory block BLK1 may include a plurality of cell strings CS1 to CSm. The first to $m^{th}$ cell strings CS1 to CSm may be coupled to the first to $m^{th}$ bit lines BL1 to BLm, respectively.

Each of the cell strings CS1 to CSm may include a drain selection transistor DST, a plurality of memory cells MC1 to MCn coupled in series, and a source selection transistor SST. The drain selection transistor DST may be coupled to a drain selection line DSL1. The first to $n^{th}$ memory cells MC1 to MCn may be coupled to first to $n^{th}$ word lines WL1 to WLn, respectively. The source selection transistor SST may be coupled to a source selection line SSL1. A drain side of the drain selection transistor DST may be coupled to a corresponding bit line. A source side of the source selection transistor SST may be coupled to a reference voltage node. According to an embodiment, a source side of the source selection transistor SST may be coupled to a common source line (not illustrated). The common source line may be biased to a reference voltage.

Memory cells coupled to a single word line of the first to $m^{th}$ cell strings CS1 to CSm may form a single page pg. Therefore, the memory block BLK1 may include a plurality of pages.

The drain selection line DSL1, the first to $n^{th}$ word lines WL1 to WLn and the source selection line SSL1 may be included in the row lines RL shown in FIG. 2. The drain selection line DSL1 the first to $n^{th}$ word lines WL1 to WLn and the source selection line SSL1 may be controlled by the address decoder 121. The first to $m^{th}$ bit lines BL1 to BLm may be controlled by the read and write circuit 123.

Referring again to FIG. 2, the peripheral circuit 120 may include the address decoder 121, a voltage generator 122, the read and write circuit 123, an input/output buffer 124 and a control logic 125.

The address decoder 121 may be coupled to the memory cell array 110 through the row lines RL. The address decoder 121 may be controlled by the control logic 125. The address decoder 121 may receive a physical address PA through the control logic 125.

The read operation of the semiconductor memory device 100 may be performed in units of pages (see reference character pg in FIG. 3). The physical address PA received during the read operation ray include a block address and a row address.

The address decoder 121 may decode the block address of the received physical address PA. The address decoder 121 may select one of the memory blocks BLK1 to BLKz according to the decoded block address.

The address decoder 121 may decode the row address of the received physical address PA and select one word line in a selected memory block. Thus, a single page may be selected. The address decoder 121 may apply a read voltage from the voltage generator 122 to the selected word line and apply a pass voltage from the voltage generator 122 to unselected word lines.

The voltage generator 122 may be controlled by the control logic 125. The voltage generator 122 may generate an internal power voltage by using an external power voltage provided to the semiconductor memory device 100. For example, the voltage generator 122 may generate the internal power voltage by regulating the external power voltage. The internal power voltage may be provided to the address decoder 121, the read and write circuit 123, the input/output buffer 124 and the control logic 125 and used as an operation voltage of the semiconductor memory device 100.

The voltage generator 122 may generate a plurality of voltages by using at least one of the external power voltage and the internal power voltage. According to an embodiment, the voltage generator 122 may include a plurality of pumping capacitors receiving the internal power voltage and generate a plurality of voltages by selectively activating the plurality of pumping capacitors under the control of the control logic 125. For example, the voltage generator 122 may generate a read voltage and a pass voltage having a higher voltage level than the read voltage during the read operation. The generated voltages may be provided to the address decoder 121.

The read and write circuit 123 may be coupled to the memory cell array 110 through the bit lines BL. The read and write circuit 123 may be controlled by the control logic 125.

The read and write circuit 123 may read and store read data DATA from the page of the selected word line of the memory cell array 110 during the read operation. The read data DATA may be transferred to the input/output buffer 124 through data lines DL.

The input/output buffer 124 may be coupled to the read and write circuit 123 through the data lines DL. The input/output buffer 124 may be controlled by the control logic 125.

The input/output buffer 124 may externally output the read data DATA transferred from the read and write circuit 123 through the data lines DL.

The control logic 125 may control the general operation of the semiconductor memory device 100. The control logic 125 may receive a command CMD and the physical address PA. During a read operation, the command CMD may be a read command. During a program operation, the command CMD may indicate the program operation. During an erase operation, the command CMD may indicate the erase operation. The control logic 125 may control the address decoder 121, the voltage generator 122, the read and write circuit 123 and the input/output buffer 124 in response to the received command CMD.

A parameter setting command to change a setting value of the semiconductor memory device 100 may be received as the command CMD. For example, the parameter setting command may include information to change the read voltage. The control logic 125 may control the voltage generator 122 to change the read voltage in response to the parameter setting command. For example, the parameter setting command may include information to change the pass voltage.

A threshold voltage distribution of memory cells included in each page may be shifted for various reasons. It is widely known that data of a selected word line is identified as different read data by controlling a read voltage. In other words, by applying an inappropriate read voltage, many error bits may be included in read data. By controlling the read voltage, the error bits included in the read data may be reduced. When a read command fails since read data obtained by performing the read command includes many error bits, the controller 200, shown in FIG. 1, may control the read voltage by providing the parameter setting command to the semiconductor memory device 100, and receive read data of the corresponding page again by transferring the read command again.

Figure 4:
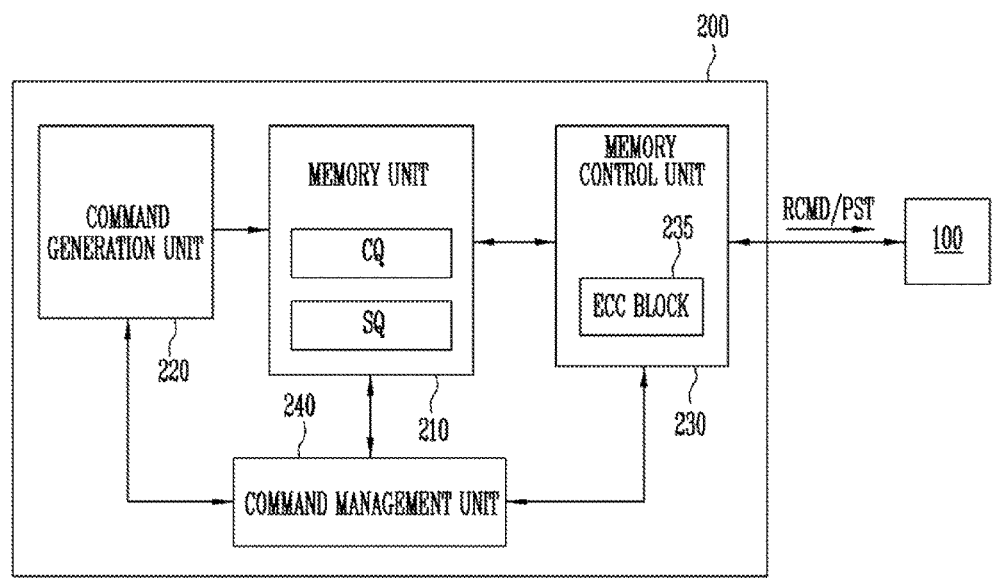
FIG. 4 is a block diagram illustrating a controller shown in FIG. 1 according to an embodiment.

FIG. 4 is a block diagram illustrating the controller 200 described with reference to FIG. 1 according to an embodiment.

Referring to FIG. 4, the controller 200 may include a memory unit 210, a command generation unit 220, a memory control unit 230, and a command management unit 240.

The memory unit 210 may be coupled to the command generation unit 220, the memory control unit 230, and the command management unit 240. The memory unit 210 may provide a storage space in the controller 200. In the memory unit 210, a command queue CQ and a status information queue SQ may be defined. Both the command queue. CQ and the status information queue SQ may be managed using a first-in first-out basis. Each of the command queue CQ and the status information queue SQ may include a head address HA and a tail address TA.

The command generation unit 220 may be coupled to the memory unit 210 and the command management unit 240. The command generation unit 220 may be controlled by the command management unit 240. In response to a request from the host, the command generation unit 220 may generate a command corresponding to the request under the control of the command management unit 240.

According to an embodiment, the command generation unit 220 may function as the flash translation layer (FTL). The command generation unit 220 may transform a logical block address included in the request from the host into a physical block address. When the corresponding command is stored in the command queue CQ, the command generation unit 220 may store the generated physical address in connection with the corresponding command in the memory unit 210. The physical address stored in the memory unit 210 may be transferred to the semiconductor memory device 100, along with the corresponding command, by the memory control unit 230.

According to an embodiment, the command generation unit 220 may generate a plurality of commands for identifying data of a page (hereinafter, selected page) corresponding to the read request, and store the generated commands in the command queue CQ defined in the memory unit 210. According to an embodiment the command generation unit 220 may repeat generating of the read command and the parameter setting command, and input the generated read commands and parameter setting commands in the command queue CQ.

According to an embodiment, the command generation unit 220 may generate a plurality of commands for identifying data of the selected page in response to the read request. The generated commands may be sequentially provided to the semiconductor memory device 100.

According to an embodiment, the command generation unit 220 may firstly generate a single read command in response to the read request. The read command and the corresponding physical address may be provided to the semiconductor memory device 100. Read data may be received from the semiconductor memory device 100. When decoding of the read data fails, the command generation unit 220 may generate a plurality of commands for identifying the data of the selected page under the control of the command management unit 240.

The memory control unit 230 may be coupled to the memory unit 210 and the command management unit 240. The memory control unit 230 may include an ECC block 235. The memory control unit 230 may be controlled by the command management unit 240.

The memory control unit 230 may output a command from the command queue CQ under the control of the command management unit 240, and provide the output command to the semiconductor memory device 100.

When a read command RCMD is output from the command queue CQ, the semiconductor memory device 100 may receive the read command RCMD. The semiconductor memory device 100 may provide read data to the controller 200 in response to the read command RCMD. The read data may include data bits stored in a single page. The ECC block 235 of the memory control unit 230 may decode the read data through an error correction code to correct an error in the read data. When the decoding succeeds or the read command RCMD passes, the memory control unit 230 may store status information indicating that the read command RCMD passes in the status information queue SQ defined in the memory unit 210. When the decoding fails or the read command RCMD fails, the memory control unit 230 may store status information indicating that the read command RCMD fails in the status information queue SQ.

After the read command RCMD is output, when a parameter setting command PST is output from the command queue CQ, the semiconductor memory device 100 may change an internal setting value.

The next read command RCMD may be output from the command queue CQ on a first-in first-out basis. The memory control unit 230 may provide the next read command RCMD to the semiconductor memory device 100. The semiconductor memory device 100 may provide second read data to the controller 200 in response to the next read command RCMD. According to an embodiment, the second read data may be temporarily stored in the memory control unit 230 or the memory unit 210. The ECC block 235 of the memory control unit 230 may decode the second read data through the error correction code. According to a decoding result, the memory control unit 230 may store second status information in the status information queue SQ.

By the above-described manner, the controller 200 may sequentially provide the read commands and the parameter setting commands stored in the command queue CQ to the semiconductor memory device 100, receive the corresponding read data, and decode the received read data. Information indicating whether the read data is successfully decoded or whether the corresponding read command passes or fails may be stored as status information in the status information queue SQ.

The command management unit 240 may control the memory unit 210, the command generation unit 220 and the memory control unit 230. The command management unit 240 may control the command generation unit 220 to generate a plurality of commands in response to the read request from the host. The command management unit 240 may control the memory control unit 230 to transfer the command stored in the command queue CQ to the semiconductor memory device 100.

The command management unit 240 may manage the command queue CQ with reference to the status information stored in the status information queue SQ. A start address and an end address of the command queue CQ may indicate locations of the plurality of commands for identifying the data of the selected page in the command queue CQ. The start address and the end address may be defined between the head address HA and the ail address TA of the command queue CQ.

The command generation unit 220 may provide the start address and the end address to the command management unit 240. The command management unit 240 may identify the start address and the end address.

When the status information output from the status information queue SQ indicates that the read command RCMD passes, the command management unit 240 may output the error-corrected read data from the memory control unit 230 to the host. According to an embodiment, when one of the plurality of read commands passes, the command management unit 240 may abort the remaining read commands and the remaining parameter setting commands remaining in the command queue CQ, or the read commands and the parameter setting commands following the passed read command on a first-in first-out basis.

When the status information output from the status information queue SQ indicates that the read command RCMD fails, the command management unit 240 may determine whether the next read command RCMD passes. The command management unit 240 may determine whether the next read command RCMD passes on the basis of the next status information output from the status information queue SQ. As a result of the determination, the command management unit 240 may abort the remaining read commands and the remaining parameter setting commands remaining in the command queue CQ. For example, when the next read command RCMD passes, the read commands and the parameter setting commands following the next read command RCMD on the first-in first-out basis may be aborted.

Unlike the present invention, it is assumed that the command generation unit 220 generates a single read command to identify data of a selected page, and generates other commands, e.g., a parameter setting command and another read command, according to whether the read command fails. When the corresponding read command fails, the command generation unit 220 generates a parameter setting command and a next read command to identify the data of the selected page again. Thus, the command generation unit 220 needs to stop the operation that is currently being performed. For example, the command management unit 240 may transfer an interrupt signal to the command generation unit 220, and the command generation unit 220 may stop the currently performed operation in response to the interrupt signal. Therefore, operating time of the command generation unit 220 and the controller 200 may be increased. When another command, e.g., a program command, is already input to the command queue CQ, the command generation unit 220 may search another command, e.g., the program command, in the command queue CQ. Subsequently, the command generation unit 220 may abort the searched command, or add another command for identifying the data of the selected page to an address previous to the address of the searched command. Therefore, operating time of the command generation unit 220 and the controller 200 may be increased.

According to an embodiment of the present invention, the command generation unit 220 may generate a plurality of commands for identifying the data of the selected page and store the generated commands in the command queue CQ. When one of the read commands output from the command queue CQ passes, the remaining commands in the command queue CQ may be aborted or the commands that follow the passed read command on the first-in first-out basis may be aborted. In parallel with the cancellation, the command generation unit 220 may perform other operations. Therefore, operating time of the command generation unit 220 and the controller 200 may be improved.

FIG. 5 is a flowchart illustrating an operating method of the controller 200 according to an embodiment.

Referring to FIGS. 4 and 5, at step S110, a plurality of read commands and a plurality of parameter setting commands may be generated. The read commands and the parameter setting commands may be for identifying the data of a selected page. When decoding of a first read data fails, the command generation unit 220 may generate the read commands and the parameter setting commands for identifying the data of the selected page under the control of the command management unit 240. At step S120, the generated commands may be stored in the command queue CQ.

At step S130, while the read commands and the parameter setting commands are sequentially provided to the semiconductor memory device 100, it may be determined whether each of the read commands passes.

When the read command RCMD is provided to the semiconductor memory device 100, the memory control unit 230 may receive read data corresponding to the read command RCMD from the semiconductor memory device 100. The memory control unit 230 may decode the read data and store information on whether the read data is successfully decoded as first status information in the status information queue SQ. When the parameter setting command is provided to the semiconductor memory device 100, the semiconductor memory device 100 may change an internal setting value. When the next read command RCMD is provided to the semiconductor memory device 100, the memory control unit 230 may receive read data corresponding to the next read command RCMD from the semiconductor memory device 100. The memory control unit 230 may decode the corresponding read data and store information on whether the corresponding read data is successfully decoded as second status information in the status information queue SQ. The first and second status information may be stored in the status information queue SQ on a first-in first-out basis.

The command management unit 240 may monitor the status information queue SQ. The command management unit 240 may check the status information queue SQ and determine whether each read command passes.

The memory control unit 230 which transfers the read commands and the parameter setting commands to the semiconductor memory device 100 and stores the status information in the status information queue SQ, and the command management unit 240 which checks the status information queue SQ and determines whether each command passes may perform these operations in parallel.

At step S140, when one of the read commands passes, step S150 may be performed. When all of the read commands fail ("NO" at step S140), it may mean that all of the commands generated at step S110 are provided to the semiconductor memory device 100 and the identifying of the data of the selected page fails despite all of the read commands and parameter setting commands.

At step S150, the remaining read commands and parameter setting commands in the command queue CQ may be aborted, or the read commands and the parameter setting commands following the passed read command on first-in first-out basis may be aborted.

FIG. 6 is a conceptual diagram illustrating the command queue CQ.

Referring to FIG. 6, the command queue CQ may store commands between the head address HA and the tail address TA. The head address HA may indicate the location of the first command CMD1 in the command queue CQ. The last command CMDq of the command queue CQ may be specified by the tail address TA. The command queue CQ may be managed on first-in first-out basis. The commands of the head address HA may be firstly input to the command queue CQ and output to the semiconductor memory device 100. The commands of the tail address TA may be lastly input to the command queue CQ and output to the semiconductor memory device 100.

The commands CMD1 to CMDp, RCMD1 to RCMDx, PST1 to PSTy, and CMDp+1 to CMDq generated by the command generation unit 220 may be stored in the command queue CQ in order of input to the command queue CQ. The commands stored in the command queue CQ may have their own addresses of the command queue CQ.

For example, when first to $p^{th}$ commands CMD1 to CMDp are sequentially stored in the command queue CQ, the command generation unit 220 may generate first to $x^{th}$ read commands RCMD1 to RCMDx and first to $y^{th}$ parameter setting commands PST1 to PSTy for identifying the data of the selected page. The generated read commands RCMD1 to RCMDx and parameter setting commands PST1 to PSTy may be stored in the command queue CQ in order of input to the command queue CQ. The read commands RCMD1 to RCMDx and the parameter setting commands PST1 to PSTy may be sequentially stored between the start address SA of the command queue CQ and the end address EA of the command queue CQ. The command generation unit 220 may notify the command management unit 240 of the start address SA of the command queue CQ and the end address EA of the command queue CQ. Thus, the command management unit 240 may recognize that the commands for identifying the data of the selected page are located between the start address SA of the command queue CQ and the end address EA of the command queue CQ.

FIG. 6 illustrates the read commands and the parameter setting commands alternately arranged in the command queue CQ. In FIG. 6, the first read command RCMD1 the first parameter setting command PST1, the second read command RCMD2, the second parameter setting command PST2 . . . the $y^{th}$ parameter setting command PSTy, and the $x^{th}$ read command RCMDx may be sequentially arranged in the command queue CQ. However, this is only an example. For another example, the command generation unit 220 may arrange different numbers and orders of read commands and parameter setting commands in the command queue CQ. In other words, the read commands and the parameter setting commands may be arranged in the command queue CQ according to an implementation method of the command generation unit 220 and an implementation method of the ECC block 235.

After the read commands RCMD1 to RCMDx and the parameter setting commands PST1 to PSTy are stored in the command queue CQ, the command generation unit 220 may generate other commands CMDp+1 to CMDq. The generated p+1$^{th}$ to $q^{th}$ commands CMDp+1 to CMDq may be stored in the command queue CQ in a sequential manner from the end address EA.

The first to $p^{th}$ commands CMD1 to CMDp and the p+1$^{th}$ to $q^{th}$ commands CMDp+1 to CMDq may not be the commands for identifying the data of the selected page. Under this condition, the commands CMD1 to CMDq may not be limited. For example, each of the commands CMD1 to CMDq may be one of commands for program operations, erase operations, and other read operations in response to another read request.

All of the commands stored in the command queue CQ may be output on a first-in first-out basis. For example, the memory control unit 230 may sequentially increase an operation pointer OP from the head address HA and output a command pointed by the operation pointer OP. After the first to $p^{th}$ commands CMD1 to CMDp are output, the commands RCMD1 to RCMDx and PST1 to PSTy for identifying the data of the selected page may be output.

FIG. 6 illustrates the operation pointer OP pointing to the first read command RCMD1. The first read command RCMD1 may be output. When the first read command RCMD1 is provided to the semiconductor memory device 100, the semiconductor memory device 100 may transfer the first read data corresponding to the first read command RCMD1 to the controller 200.

The first parameter setting command PST1 may be output. The semiconductor memory device 100 may change an internal setting value in response to the first parameter setting command PST1. Subsequently, the second read command RCMD2 may be output. When the second read command RCMD2 is provided to the semiconductor memory device 100, the semiconductor memory device 100 may transfer the second read data corresponding to the second read command RCMD2 to the controller 200.

It may be determined whether the first read command RCMD1 passes according to the first read data. The first read data may be decoded. The status information may be stored in the status information queue SQ indicating whether the first read data is successfully decoded. It may be determined whether the first read command RCMD1 passes based on the status information. When the first read command RCMD1 passes, the command management unit 240 may abort the remaining commands, among the commands RCMD1 to RCMDx and PST1 to PSTy between the start address SA and the end address EA. For example, when the second read command RCMD2 is output and it is detected that the first read command RCMD1 passes, the remaining commands RCMD3 to RCMDx and PST2 to PSTy following the first read command RCMD1 between the start address SA and the end address EA may be aborted.

FIG. 7 is a flowchart illustrating an embodiment of step S150 described with reference to FIG. 5.

Referring to FIGS. 4, 6 and 7, at step S310, the command management unit 240 may define a shadow pointer SP between the start address SA and the end address EA when it is detected that one of the read commands in the command queue CQ passes. For example, the command management unit 240 may inquire with the memory control unit 230 the location of the operation pointer OP, and define the operation pointer OP as the shadow pointer SP. This means that the command queue CQ stores the remaining read commands and the remaining parameter setting commands between the address indicated by the shadow pointer SP and the end address EA. That is, the read commands and the parameter setting commands following the passed read command on first-in first-out basis may be stored between the address indicated by the shadow pointer SP and the end address EA in the command queue CQ.

At step S320, the command management unit 240 may erase a command of the address indicated by the shadow pointer SP. At step S330, the command management unit 240 may move the shadow pointer SP to the next address in the command queue CQ. At step S340, when the shadow pointer SP indicates the end address EA, the command management unit 240 may abort the command of the end address EA and stop the cancellation of the remaining read commands and the remaining parameter setting commands. When the shadow pointer SP has not indicated the end address EA yet, steps S320 to S340 may be repeated. In other words, steps S320 to S340 may be repeated until the shadow pointer SP indicates the end address EA. According to another embodiment, step S330 may be performed before step S320.

FIG. 8 is a conceptual diagram of an embodiment shown in FIG. 7.

Referring to FIG. 8, the first to $p^{th}$ commands CMD1 to CMDp may be output first. The memory control unit 230 may output the command pointed to by the operation pointer OP while sequentially moving the operation pointer OP to the next address from the head address HA. FIG. 8 illustrates the output commands with hatched lines.

The memory control unit 230 may output the first read command RCMD1, the first parameter setting command PST1 and the second read command RCMD2 while moving the operation pointer OP to the next address.

The shadow pointer SP may be defined between the start address SA and the end address EA when it is detected that one of the read commands in the command queue CQ passes. The command management unit 240 may inquire with the memory control unit 230 the location of the operation pointer OP, and define the shadow pointer SP so that the shadow pointer SP may point to the address of the operation pointer OP. FIG. 8 illustrates the operation pointer OP pointing to the address of the second read command RCMD2. Subsequently, the command management unit 240 may repeat erasing of the command of the address indicated by the shadow pointer SP and move the shadow pointer SP to the next address until the shadow pointer SP indicates the end address EA. The command management unit 240 may control the memory unit 210 to erase the commands stored at the address indicated by the shadow pointer P. Therefore, the remaining read commands CMD3 to RCMDx and the remaining parameter setting commands PST2 to PSTy in the command queue CQ may be aborted.

According to an embodiment, the remaining command may not be output from the command queue CQ, and the remaining read commands and the remaining parameter setting commands may be aborted. Therefore, the remaining commands may be aborted more promptly.

Figure 9:
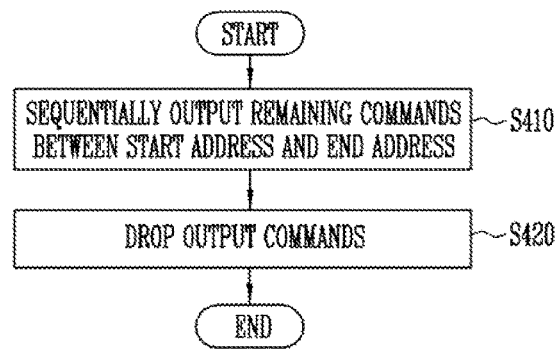
FIG. 9 is a flowchart illustrating another embodiment of step S150 shown in FIG. 5.

FIG. 9 is a flowchart illustrating another embodiment of step S150 described with reference to FIG. 5.

Referring to FIGS. 4, 6 and 7, at step S410, when it is detected that one of the read commands in the command queue CQ passes, the command management unit 240 may sequentially output from the command queue CQ the remaining commands following the passed read command on first-in first-out basis between the start address SA and the end address EA. Since the command queue CQ is operated on a first-in first-out basis, the output commands may be erased from the command queue CQ.

At step S420, the command management unit 240 may drop the output commands.

Figure 10:
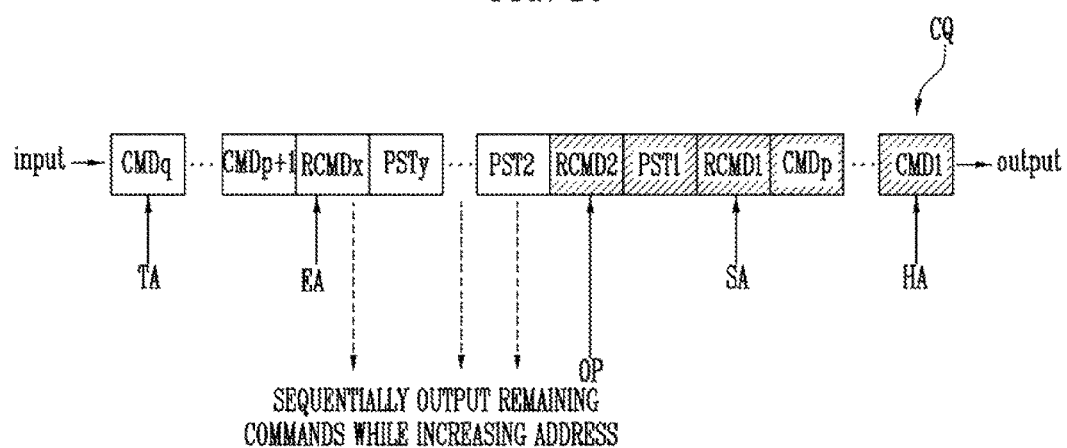
FIG. 10 is a conceptual diagram of the embodiment shown in FIG. 9.

FIG. 10 is a conceptual diagram of an embodiment shown in FIG. 9.

Referring to FIG. 10, the first to $p^{th}$ commands CMD1 to CMDp may be output. FIG. 10 illustrates the output commands as hatched lines. The operation pointer OP may reach the start address SA.

Subsequently, the memory control unit 230 may output the first read command RCMD1, the first parameter setting command PST1 and the second read command RCMD2 while moving the operation pointer OP from the start address SA to the next address.

For example, when the first read command RCMD1 or the second read command RCMD2 passes, the command management unit 240 may inquire with the memory control unit 230 to determine the location of the operation pointer OP, and sequentially output the remaining commands following the passed first or second read command RCMD1 or RCMD2 on first-in first-out basis between the start address SA and the end address EA while moving the operation pointer OP to the next address in the command queue CQ. FIG. 10 exemplarily illustrates the operation pointer OP pointing to the second read command RCMD2. The commands of the address indicated by the operation pointer OP may be sequentially output by the command management unit 240. Subsequently, the output commands, which follow the passed read command on the first-in first-out basis and are indicated by the operation pointer OP, may be dropped. The command management unit 240 may drop the sequentially output read commands. In other words, the sequentially output read command following the passed read command on the first-in first-out basis may be ignored. Thus, the remaining read commands and the remaining parameter setting commands in the command queue CQ may be aborted.

According to an embodiment, even when the remaining read commands and the remaining parameter setting commands following the passed read command on the first-in first-out basis are aborted, the remaining commands may also be output from the command queue CQ without the cancellation process in the command queue CQ as described with reference to FIGS. 7 and 8. Thus, the design of the command management unit 240 may be simplified.

Figure 11:
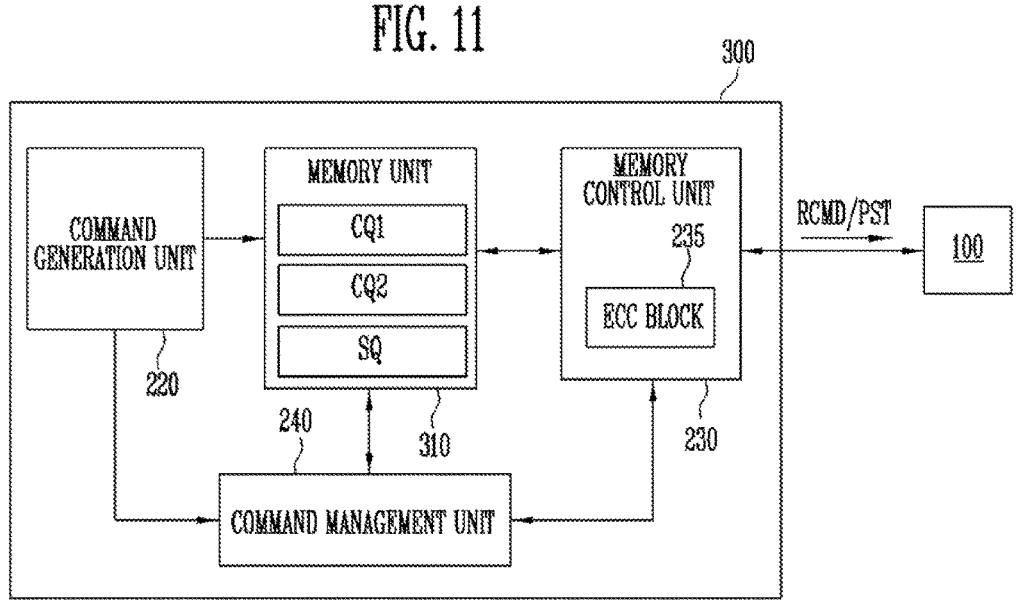
FIG. 11 is a block diagram illustrating a controller shown in FIG. 1 according to another embodiment.
Figure 12:
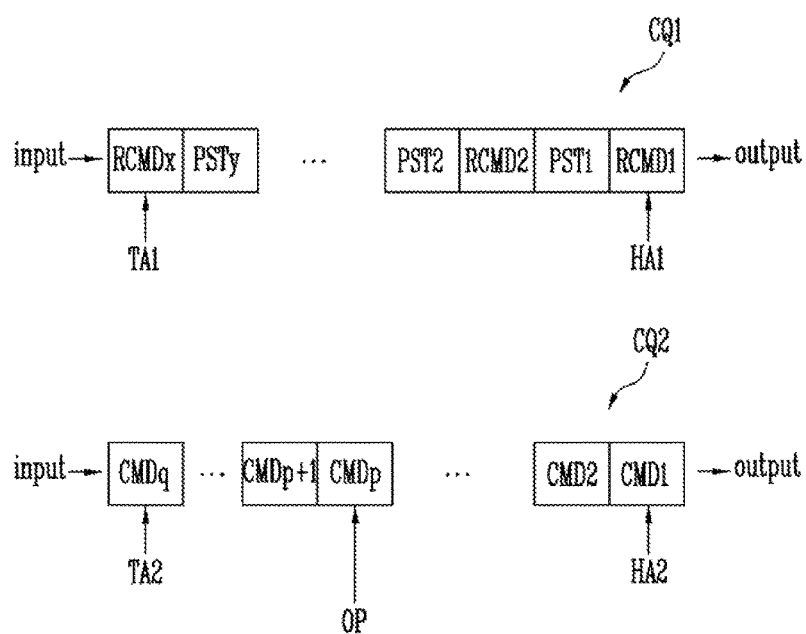
FIG. 12 is a conceptual diagram illustrating first and second command queues shown in FIG. 11.

FIG. 11 is a block diagram illustrating the controller 200 shown in FIG. 1 according to another embodiment. FIG. 12 is a conceptual diagram of first and second command queues CQ1 and CQ2 shown in FIG. 11.

Referring to FIGS. 11 and 12, the controller 300 may include a memory unit 310, the command generation unit 220, the memory control unit 230, and the command management unit 240.

The memory unit 310 may include the first command queue CQ1, the second command queue CQ2 and the status information queue SQ. The first command queue CQ1 may include a first head address HA1 and a first tail address TA1. The second command queue CQ2 may include a second head address HA2 and a second address TA2. The memory unit 310 may store the plurality of commands RCMD1 to RCMDx and PST1 to PSTy for identifying the data of the selected page in the first command queue CQ1. The command generation unit 220 may store other commands CMD1 to CMDq in the second command queue CQ2.

The command generation unit 220 may store a command corresponding to a request from the host in the second command queue CQ2. The commands CMD1 to CMDq stored in the second command queue CQ2 may be sequentially output from the second head address HA2 and provided to the semiconductor memory device 100.

For example, when the operation pointer OP indicates the $p^{th}$ command CMDp, the $p^{th}$ command CMDp may correspond to the command corresponding to the read request from the host. The $p^{th}$ command CMDp and a physical address indicating the selected page may be provided to the semiconductor memory device 100. The semiconductor memory device 100 may transfer the corresponding read data to the controller 300. The memory control unit 230 may decode the read data and store information on whether the read data is successfully decoded in the status information queue SQ. When the $p^{th}$ command CMDp is determined to fail as a result of checking the status information queue SQ, the command management unit 240 may control the command generation unit 220 to generate the commands RCMD1 to RCMDx and PST1 to PSTy for identifying the data of the selected page, and input the generated commands RCMD1 to RCMDx and PST1 to PSTy to the separate command queue CQ1.

Then, the operation pointer OP may be locked to the current address in the second command queue CQ2, and the commands RCMD1 to RCMDx and PST1 to PSTy in the first command queue CQ1 may be output on a first-in first-out basis.

According to this embodiment, the commands RCMD1 to RCMDx and PST1 to PSTy for identifying the data of the selected page may be stored in the first command queue CQ1. When one of the read commands output from the first command queue CQ1 passes, the remaining read commands and the remaining parameter setting commands following the passed read command on the first-in first-out basis may be erased from the first command queue CQ1 for the cancellation. The first command queue CQ1 may be initialized for the cancellation. Since the commands RCMD1 to RCMDx and PST1 to PSTy for identifying the data of the selected page are stored in the first command queue CQ1, the remaining commands may be aborted without managing the start address SA and the end address EA described with reference to FIG. 6. Therefore, the design of the command management unit 240 may be simplified.

FIG. 13 is a view illustrating the memory control unit 230 described with reference to FIGS. 4 and 11. FIG. 14 is a conceptual diagram illustrating code words CW1 to CW4 included in read data. FIG. 15 is a conceptual diagram illustrating a decoding status table DT shown in FIG. 13.

Referring to FIG. 13, the memory control unit 230 may include a memory controller 431, a data buffer 432, the ECC block 235 and a multiplexing block MUX.

The memory controller 431 may control the data buffer 432, the ECC block 235 and the multiplexing block MUX. The memory controller 431 may output the read command RCMD from the command queue CQ in response to the command management unit 240, and provide the output read command RCMD to the semiconductor memory device 100. The read data from the semiconductor memory device 100 may be stored in the data buffer 432. The memory controller 431 may control the multiplexing block MUX to transfer part or all of the code words in the read data stored in the data buffer 432 to the ECC block 235. The memory controller 431 may refer to the decoding status table DT.

The read data transferred from the semiconductor memory device 100 may include data bits stored in a single page. The data bits may be divided into a plurality of code words. For example, as shown in FIG. 14, the read data may include the first to fourth code words CW1 to CW4.

The ECC block 235 may perform a decoding operation in units of code words. The ECC block 235 may be controlled by the memory controller 431. The ECC block 235 may receive one or more code words through the multiplexing block MUX and decode each one of the code words according to an error correction code. Whenever the memory control unit 230 receives read data corresponding to the read commands RCMD1 to RCMDx, the ECC block 235 may receive the code words in the read data. In addition, the ECC block 235 may feedback information on whether the received code word is successfully decoded to the memory controller 431. According to an embodiment, the ECC block 235 may temporarily store the error-corrected code word in the memory unit 210.

According to an embodiment, the memory controller 431 may store the decoding status table DT. The decoding status table DT may include information on whether the decoding of each of the code words passes or fails. As show in FIG. 15, the decoding status table DT of the memory controller 431 may include information whether each of the first to fourth code words CW1 to CW4 is successfully decoded. The memory controller 431 may receive the information on whether each code word succeeds from the ECC block 235 and update the decoding status table DT based on the received information. For example, as the semiconductor memory device 100 performs the read operations in response to more read commands and parameter setting commands, more of the first to fourth code words CW1 to CW4 may be successfully decoded.

FIG. 15 illustrates the decoding status table DT including the information indicating whether the decoding of the first and second code words CW1 and CW2 passes and whether the decoding of the third and fourth code words CW3 and CW4 fails. For example, when the ECC block 235 successfully decodes the third code word CW3, the memory controller 431 may update information corresponding to the third code word CW3 from fail to pass in the decoding status table DT. When the ECC block 235 fails in decoding one or more of the first to fourth code words CW1 to CW4, the memory controller 431 may store the status information indicating that the corresponding read command fails in the status information queue. SQ. Whenever the ECC block 235 successfully decodes each of the first to fourth code words CW1 to CW4, the memory controller 431 may store the status information indicating that the corresponding read command passes in the status information queue SQ.

According to an embodiment, the memory controller 431 may control the multiplexing block MUX to transfer only the decoding-failed one of the code words CW1 to CW4 from the data buffer 432 to the ECC block 235 by referring to the decoding status table DT. Therefore, the ECC block 235 may not repeat decoding of all of the read data. Therefore, the amount of time needed to decode the read data may be improved.

FIG. 13 illustrates the decoding status table DT included in the memory control unit 230. However, this is only an example. In another example, the decoding status table DT may be stored in the memory unit 210.

Figure 16:
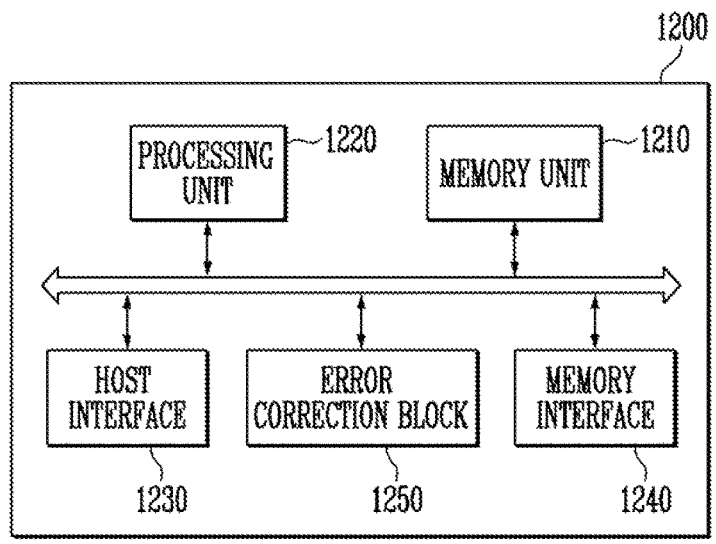
FIG. 16 is a block diagram illustrating an embodiment of a controller shown in FIGS. 4 and 11.

FIG. 16 is a block diagram illustrating an embodiment 1200 of the controller 200 and 300 described with reference to FIGS. 4 and 11.

Referring to FIG. 16, the controller 200 may include a memory unit 1210, a processing unit 1220, a host interface 1230, a memory interface 1240 and an error correction block 1250.

The processing unit 1220 may control the general operation of the controller 1200. The memory unit 1210 may be used as operation memory of the processing unit 1220, a cache memory between the semiconductor memory device 100, shown in FIGS. 4 and 11, and the host, and/or a buffer memory between the semiconductor memory device 100 and the host. The processing unit 1220 and the memory unit 1210 may function as the command generation unit 220 and the command management unit 240 shown in FIGS. 4 and 11. For example, the processing unit 1220 may load a program command, a data file, and a data structure in the memory unit 1210, and perform the functions of the command generation unit 220 and the command management unit 240 by executing the loaded data.

Additionally, the memory unit 1210 may be used as the memory units 210 and 310 shown in FIGS. 4 and 11. FIG. 16 illustrates providing one memory unit 1210. However, two or more memory units may be provided.

The host interface 1230 may include a protocol for exchanging data between the host and the controller 1200. For example, the controller 1200 may communicate with the host through one or more protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol an integrated drive electronics (IDE) protocol, a private protocol, etc.

The memory interface 1240 may interface with the semiconductor memory device 100. The error correction block 1250 may decode the read data received from the semiconductor memory device 100 by using an error correction code. The memory interface 1240 and the error correction block 1250 may perform the function of the memory control unit 230 shown in FIGS. 4 and 11.

Figure 17:
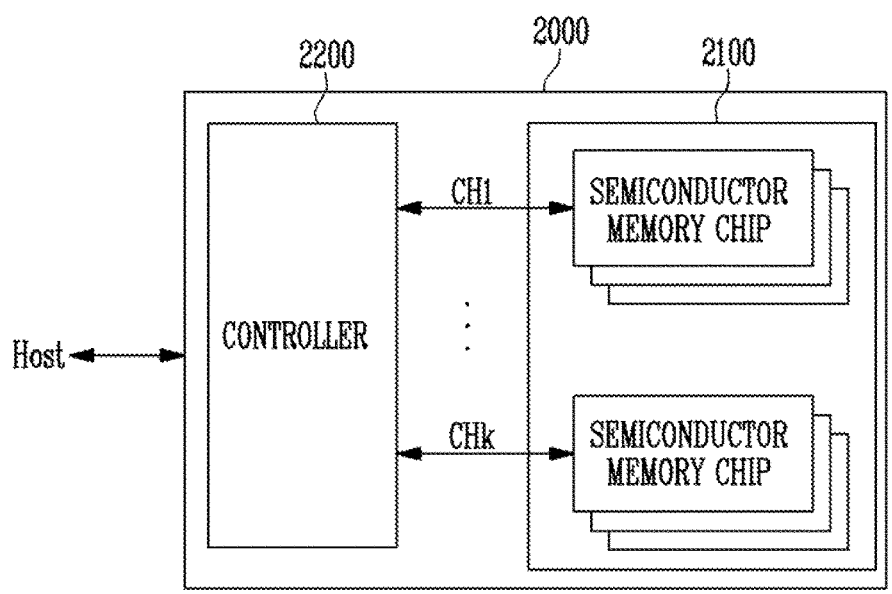
FIG. 17 is a block diagram illustrating an application example of a memory system shown in FIG. 1.

FIG. 17 is a block diagram illustrating an application example (2000) of the memory system 50 shown in FIG. 1.

Referring to FIG. 17, the memory system 2000 may include a semiconductor memory device 2100 and a controller 2200. The semiconductor memory device 2100 may include a plurality of semiconductor data chips. The plurality of semiconductor data chips may be divided into a plurality of groups.

In FIG. 17, the plurality of groups may communicate with the controller 2200 through first to $k^{th}$ channels CH1 to CHk, respectively. Each of the semiconductor data chips may be configured and operate in substantially the same manner as the semiconductor memory device 100 described above with reference to FIGS. 1 to 3.

Each of the groups may communicate with the controller 2200 through a single common channel. The controller 2200 may be configured in substantially the same manner as the controller 1200 described above with reference to FIG. 16, and configured to control the plurality of data chips of the semiconductor memory device 2100 through the plurality of channels CH1 to CHk.

FIG. 17 illustrates the plurality of semiconductor data chips coupled to a single channel. However, the memory system 2000 may be modified so that a single semiconductor data chip may be coupled to a single channel.

According to an embodiment, a command generation unit may generate commands for identifying data of a selected page and store the generated commands in a command queue. When a read command read from the command queue passes, commands remaining in the command queue among the corresponding commands may be aborted. The command generation unit may perform other operations. Therefore, the operating time of the command generation unit and a controller may be improved.

According to an embodiment, a controller having an improved operating time and an operating method thereof are provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An operating method for controlling a semiconductor memory device, the operating method comprising:
   storing a plurality of read commands in a command queue managed on first-in first-out basis;
   providing one of the read commands to the semiconductor memory device;
   determining whether the provided read command passes or fails based on read data, which is provided from the semiconductor memory device in response to the provided read command; and
   aborting remaining read commands in the command queue when the provided read command passes.

2. The operating method of claim 1,
   wherein the semiconductor memory device includes a plurality of pages, and
   wherein the plurality of read commands are for identifying data stored in one of the pages.

3. The operating method of claim 1,
   wherein the determining performs ECC decoding on the read data, and
   wherein the provided read command passes when the ECC decoding passes.

4. The operating method of claim 1, further comprising:
   repeating the providing and determining with the remaining read commands when the provided read command fails.

5. The operating method of claim 1, further comprising:
   generating a plurality of parameter setting commands to change a setting value of the semiconductor memory device, wherein the plurality of parameter setting commands are stored in the command queue, along with the plurality of read commands; and providing one of the plurality of parameter seating commands to the semiconductor memory device.

6. The operating method of claim 5, the aborting comprises aborting remaining parameter setting commands in the command queue when the provided read command passes.

7. The operating method of claim 5, wherein the setting value corresponds to a voltage applied to a word line of the semiconductor memory device during a read operation of the semiconductor memory device.

8. The operating method of claim 1,
wherein the command queue includes memory space from a head address to a tail address, and
wherein the plurality of read commands are stored in memory space from a start address to an end address between the head and tail addresses.

9. The operating method of claim 8, wherein the aborting comprises:
generating a shadow pointer pointing to an address corresponding to a first one of the remaining read commands when the provided read command passes; and
erasing the remaining read commands pointed to by the shadow pointer while moving the shadow pointer from a current address to a next address until the shadow pointer points to the end address.

10. The operating method of claim 8, wherein the aborting comprises sequentially dropping the remaining read commands between the start address and the end address.

11. The operating method of claim 1, wherein the aborting erases the remaining read commands stored in memory space between a start address and an end address in the command queue.

12. The operating method of claim 1, wherein the determining determines there is a failure of the provided read command when ECC decoding fails on one or more code words included in the read data.

13. The operating method of claim 12, wherein the ECC decoding is performed on one or more code words on which the ECC decoding fails in the read data previously provided from the semiconductor memory device in response to a previously provided read command.

14. A controller controlling a semiconductor memory device, the controller comprising:
a command queue managed on first-in first-out basis;
a command generation unit suitable for storing a plurality of read commands in the command queue;
a memory control unit suitable for:
providing one of the plurality of read commands to the semiconductor memory device; and
determining whether the provided read command passes or fails based on read data, which is provided from the semiconductor memory device in response to the provided read command; and
a command management unit suitable for aborting remaining read commands when the provided read command passes.

15. The controller of claim 14,
wherein the semiconductor memory device includes a plurality of pages, and
wherein the plurality of read commands are for identifying data stored in one of the plurality of pages.

16. The controller of claim 14, wherein the memory control unit repeats the providing and determining with remaining read commands when the provided read command fails.

17. The controller of claim 14, wherein the command generation unit generates parameter setting commands to change a setting value of the semiconductor memory device, and storing the parameter setting commands along with the plurality of read commands in the command queue,
the memory control unit provides one of the parameter setting commands to the semiconductor memory device, and
the command management unit aborts remaining parameter setting commands in the command queue.

18. The controller of claim 14, wherein the memory control unit comprises:
a data buffer suitable for storing the read data provided from the semiconductor memory device in response to the provided read command;
an error correction block suitable for performing ECC decoding on the read data in units of single code words;
a decoding status table suitable for storing pass or fail information of the ECC decoding on each code word included in the read data; and
a multiplexing block suitable for providing the read data in units of single code words from the data buffer to the error correction block; and
a memory controller suitable or:
controlling the multiplexing block to provide the error correction block with one or more code words on which the ECC decoding fails in the read data previously provided from the semiconductor memory device in response to previously provided read command, by referring to the decoding status table; and
updating the fail information stored in the decoding status table according to a result of the ECC decoding.

19. The controller of claim 14, wherein the memory control unit determines that the provided read command fails when ECC decoding fails on one or more code words included in the read data.

20. An operating method for controlling a semiconductor memory device including a plurality of pages, the operating method comprising:
storing a plurality of commands for identifying data of a selected page in a command queue managed on first-in first-out basis;
providing one of the commands to the semiconductor device;
repeating the providing with remaining read commands when the provided read command fails; and
aborting remaining read commands when the provided read command passes.

* * * * *